United States Patent [19]

Palanisamy

[11] Patent Number: 5,169,679
[45] Date of Patent: Dec. 8, 1992

[54] POST-TERMINATION APPARATUS AND PROCESS FOR THICK FILM RESISTORS OF PRINTED CIRCUIT BOARDS

[75] Inventor: Ponnusamy Palanisamy, Kokomo, Ind.

[73] Assignee: Delco Electronics Corporation, Kokomo, Ind.

[21] Appl. No.: 256,017

[22] Filed: Oct. 11, 1988

[51] Int. Cl.[5] .............................................. C23C 26/00
[52] U.S. Cl. .................................... 427/96; 427/102; 427/103
[58] Field of Search .......................... 427/96, 102, 103

[56] References Cited

U.S. PATENT DOCUMENTS

| | | |
|---|---|---|
| 3,609,105 | 9/1971 | Cole, Jr. . |
| 3,679,606 | 7/1972 | Short . |
| 3,717,483 | 2/1973 | Miller . |
| 3,914,514 | 10/1975 | MacKenzie et al. ................ 428/426 |
| 3,992,212 | 11/1976 | Youtsey ................................ 106/1 |
| 4,031,272 | 6/1977 | Khanna ............................... 427/103 |
| 4,063,993 | 12/1977 | Burns . |
| 4,331,740 | 5/1982 | Burns . |
| 4,404,237 | 9/1983 | Eichelberger ......................... 427/96 |
| 4,452,726 | 6/1984 | Palanisamy et al. . |
| 4,464,420 | 8/1984 | Taguchi ............................... 427/96 |
| 4,629,681 | 12/1986 | Takada ................................ 427/96 |
| 4,678,531 | 7/1987 | Metzger et al. . |
| 4,751,492 | 6/1988 | Tsuzuki et al. ..................... 338/176 |
| 4,830,878 | 5/1989 | Kaneko ............................... 427/96 |
| 4,847,003 | 7/1989 | Palanisamy ......................... 252/514 |

FOREIGN PATENT DOCUMENTS

| | | |
|---|---|---|
| 59-79563 | 5/1984 | Japan . |
| 288095 | 11/1988 | Japan ................................... 427/96 |
| 672255 | 5/1952 | United Kingdom ................. 427/96 |

OTHER PUBLICATIONS

"Encyclopedia of Electronics", 2nd Edition, by Stan Gibilisco and Neil Selator, copyright 1990 by TAB Books, pp. 467 & 722.
Solid State Technology, vol. 24, No. 1, Washington US, pp. 73-79; Stein et al; "Basic Metal Thick Film Conductors".

Primary Examiner—Shrive Beck
Assistant Examiner—Vi Duong Dang
Attorney, Agent, or Firm—Cary W. Brooks

[57] ABSTRACT

A printed circuit board includes both high and low resistive value thick film resistors interconnected by a copper film. To lower the contact resistance to the thick film resistors of high value, each is provided at its ends with a termination of a composition similar to that used for the low value resistors. This provides a relatively low resistance contact region which overcomes the difficulty that a copper thick film conductor has in making electrical connections to compositions generally used for making high value thick film resistors. The composition of high and low resistivities are adapted to permit firing of both compositions in a single firing step.

8 Claims, 4 Drawing Sheets

POST-TERMINATION APPARATUS AND PROCESS FOR THICK FILM RESISTORS OF PRINTED CIRCUIT BOARDS

FIELD OF THE INVENTION

This invention relates to printed circuits and in particular to printed circuits that include thick film resistors.

BACKGROUND OF THE INVENTION

Typical thick film resistors comprise a patterned layer (film) of a suitable resistive material of between 0.2 and 2.0 mils thick deposited on an insulating substrate. A thick film resistor is typically formed by first printing an appropriately patterned layer of suitably wet composition, usually an ink or paste, on an appropriate insulating substrate, generally an alumina ceramic board. Patterning is usually controlled by silk screen printing. The resistive composition is thereafter dried and fired (heated) to form the resistor.

Typically, printed circuit boards employ a first composition of inks or pastes for forming high resistance resistors and a different second composition for forming lower resistance resistors.

The resistance R of a particular resistor composition is generally tailored by adjusting its aspect ratio, L/W, where L is the length and W the width of the resistive film. R increases directly with L and inversely with W. R also increases inversely with the thickness of the film, but the thickness is generally kept uniform to facilitate processing. By appropriately tailoring the aspect ratio and by the use of high and low resistivity compositions of resistive material, a very wide range of resistances for the thick film resistors is achieved. Additional compositions can be used to fill in or extend the range, if necessary.

The printed circuit board typically supports a number of circuit elements (components) that are interconnected into a desired electrical circuit by an appropriately configured conductive film that is printed on the circuit board in an analogous fashion.

Copper (or a copper-rich alloy) is typically used on many printed circuit boards as the conductive film that interconnects the circuit elements since copper is of low cost, conducts well, resists migration and is easily soldered to. The copper film typically used is printed as a suspension of copper particles which is best fired in a nitrogen atmosphere to sinter the copper particles without oxidation into a good conductor. Materials typically preferred for forming thick film resistors are best fired in air. One problem is that copper films that have been formed by firing in nitrogen lose many of their favorable properties if subsequently refired in air.

One proposed solution to this problem is to first fire the thick film resistors in air and then to add copper conductors to the ends of the thick film resistors so as to make electrical contacts thereto. The copper conductors are then fired in nitrogen. This technique, in which the thick film resistors are formed first and their connections (terminations) are provided later, is generally known as "post termination". A problem with this type of post termination is that copper conductors generally make poor (high resistance) and non-uniform interfaces with the resistive film materials used in high performance thick film resistors, such as those based on a ruthenium compound ($RuO_2$ or $Bi_2Ru_2O_7$) for resistances above about 2,500 ohms.

A related concern is that this interface problem makes it difficult to accurately measure the values of such high value resistors using conventional copper-beryllium probes. Such measurements are usually important to maintain good quality control during the manufacture of printed circuit boards.

It is desirable to have a printed circuit board with high resistance thick film resistors and copper interconnections in which there is a well controlled, relatively low, and relatively uniform, contact resistance between the copper and the resistors.

SUMMARY OF THE INVENTION

The invention provides an improved technique, particularly useful for post termination, but not limited thereto, of high resistance (e.g. about 2,500 ohms or larger) thick film resistors.

One embodiment of the invention is directed to a post termination process in which a layer of a high resistivity composition for example, 25,000 ohms per square sheet resistivity, is first deposited in a pattern suitable for forming the desired high resistance resistors. Then a layer of a lower resistivity composition, for example 100 ohms per square sheet resistivity, is deposited in a pattern that not only includes the desired low resistance resistors, but also includes separate portions that overlap end portions of each of the high resistance resistors deposited earlier. These separate portions of low resistivity material serve as termination regions (electrical contact end areas) of the high resistance resistors. Thereafter a common firing step is used to fire both the high resistivity and low resistivity compositions. To this end, the two compositions are chosen to be amenable to a common firing step.

Conventional copper-beryllium probes can now be applied to these termination regions to measure the resistance of the high resistance resistors. Similarly, a nitrogen fired copper film, which is used for interconnection of the circuit elements into a circuit, is patterned to overlap these termination regions. The resultant circuit profits both from the improved copper interfaces and also from the fact that the copper interfaces with the resistors of the circuit are all essentially uniform.

Another embodiment of the invention is directed to a post termination process in which a low resistivity composition is first deposited in a suitable pattern that includes not only the low resistivity resistors but also portions suitable for termination regions. A high resistivity composition is then deposited to define high resistance resistors whose ends partially overlap the previously deposited portion of low resistivity composition designed to serve as termination regions for such resistors. The two compositions are then fired, as before, in a common firing step. Then the copper interconnection film is deposited to overlap the termination regions both of the high resistance and of the low resistance resistors.

Another embodiment of the invention is directed to a process in which the conductive film is deposited first, as is characteristic of standard terminations. The layer of low resistivity composition is then deposited either before or after the layer of high resistivity composition. It is made to contact both the conductive layer and the high resistivity layer. The layer of low resistivity again serves as an interface between the conductive layer and the layer of high resistivity.

In another aspect, the invention is directed to a printed circuit including at least one thick film resistor comprising a printed circuit board, a patterned layer of a first composition for providing at least one thick film resistor, termination means at each end of the resistor and a conductive layer for connecting to the resistor. The termination means includes a portion of a layer of a second composition whose resistivity is lower than the resistivity of the first composition. The layer portion of the second composition forms a first extended interface with each end of the resistor. The conductive layer in turn forms a second extended interface with the layer portion of the second composition of each of the termination means.

The invention should be generally applicable to improving the terminations of thick film resistors formed of high resistivity compositions where there is a strong dependence of sheet resistance on aspect ratio.

The invention may be viewed as the inclusion, in a printed circuit that is subject to such dependence, of an appropriate interface film between each end of a thick film resistor and the conductive connection thereto. The composition of the interface film generally has a resistivity lower than that of the composition of the thick film resistor, advantageously by at least a factor of 10, and preferably by of 100.

The invention will be better understood from the following more detailed description taken with the accompanying drawing.

It is to be noted that the drawings are not to scale. Background lines are not shown and there is no cross hatching of some portions to make the drawings easier to understand.

DETAILED DESCRIPTION

Figure 1A:
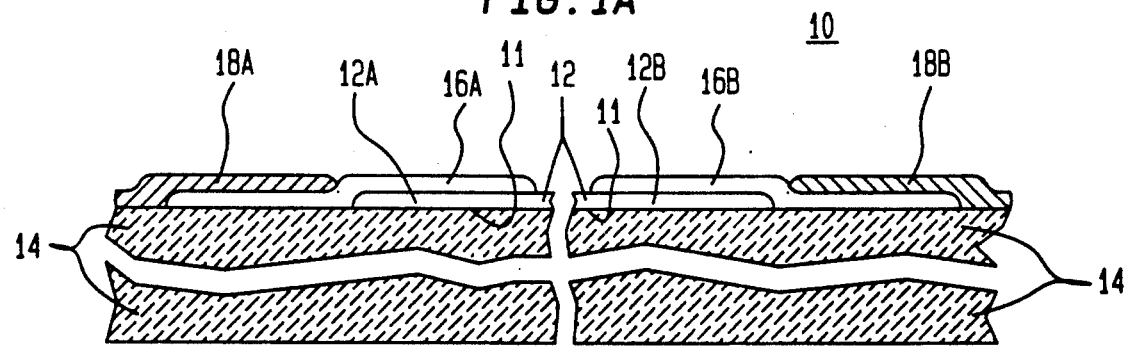
FIG. 1A shows a cross-sectional view of a thick film resistor including post terminations formed in accordance with one embodiment of the invention.

Referring now to FIG. 1A, there is shown a portion of a printed circuit board 10 including a layer 12 which is used as a thick film resistor in accordance with one embodiment of the invention. Circuit board 10 comprises a ceramic substrate 14 having a top surface 11 on which lies the layer 12 which is of relatively high sheet resistivity material and which has end portions 12A and 12B, a layer 16 of lower resistivity material having portions 16A and 16B, and a conductive layer 18 having portions 18A and 18B. In a typical embodiment the sheet resistivities of layers 12 and 16 are 25,000 and 100 ohms/square, respectively, substrate 14 is alumina, and conductive layer 18 is copper or a copper rich alloy.

The break shown in about the center of board 10 is used to denote that a body portion of the resistor of layer 12 is typically longer than the end portions 12A and 12B. The break shown in about the middle of the height of substrate 14 denotes that substrate 14 is typically considerably thicker than the layers deposited thereon.

Layer 12, which is suitable for use in a high resistance resistor, is first deposited on the substrate 14, typically as part of a larger layer consisting of many discrete portions suitable for forming many high value resistors. Next, separate layer portions 16A and 16B, which are useful as low resistance contact regions, are also deposited on the substrate 14. Layer portions 16A and 16B typically also are parts of a larger layer consisting of several discrete portions of the low resistivity material (e.g., 100 ohms/square) that also serves to provide several low value resistors of the printed circuit. Portions 16A and 16B overlap the full widths of respective end portions 12A and 12B of the layer 12. Finally, the separate copper layer portions 18A and 18B of layer 18 are deposited on the top surface 11 of the substrate 14 and each overlaps the full width of an end portion of layer portions 16A and 16B, respectively. The layer portions 18A and 18B also are typically parts of a larger copper layer consisting of many discrete portions used to interconnect various other circuit elements on the printed circuit board 10. The lengths of the overlaps, while not critical, are adequate to insure that the layer portions 16A and 16B have low resistance interfaces with both layer portions 12A and 12B respectively, and with layer portions 18A and 18B, respectively. In particular, the resistances of such extended interfaces preferably are typically a small fraction, generally no more than a few percent, of the total resistance to be provided by the thick film resistor.

Figure 1B:
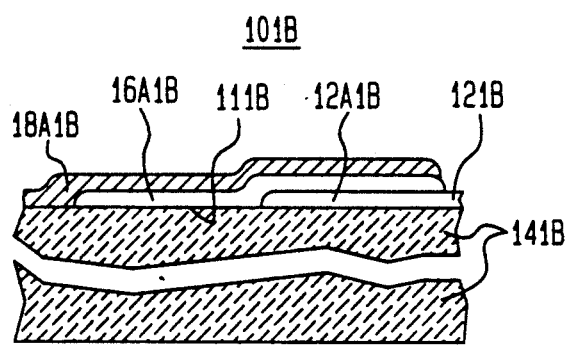
FIGS. 1B, 1C and 1D each show a cross-sectional view of a termination of a thick film resistor formed in accordance with embodiments of the invention that differ from that involved in FIG. 1A in the degree of overlap of the various layers.

Referring now to FIG. 1B, there is shown a portion of a printed circuit 101B including a ceramic substrate 141B. This supports a high resistivity layer portion 12A1B, a low resistivity layer portion 16A1B, and a conductive layer portion 18A1B, corresponding to portions 12A, 16A, and 18A of the printed circuit 10 shown in FIG. 1A. As seen in this embodiment, the conductive layer portion 18A1B extends over the full length of low resistivity layer 16A1B.

Figure 1C:
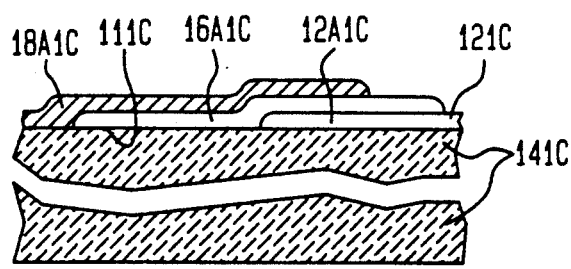

In FIG. 1C, in similar fashion, ceramic substrate 141C supports high resistivity layer portions 12A1C, low resistivity layer portions 16A1C and conductive layer portions 18A1C. In this embodiment, the conductive layer portion 18A1C overlaps only a part of low resistivity layer portion 16A1C that overlies the high resistivity layer portion 12A1C.

Figure 1D:
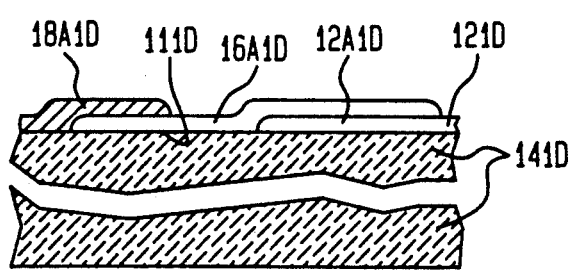

In FIG. 1D, there is shown an embodiment in which the conductive layer portion 18A1D overlies only a portion of a low resistivity layer 16A1D that lies directly on ceramic substrate top surface 111D and does not overlap the portion that overlies the high resistivity layer portion 12A1D.

The compositions used for high performance thick film resistors generally are mixtures of particles of a ruthenium compound, such as $RuO_2$ or $Bi_2Ru_2O_7$, particles of a lead borosilicate glass, traces of Temperature Coefficient of Resistance (TCR) modifiers and a screening agent. The screening agent is typically an organic vehicle that includes a solvent and a resin. It is used both to keep the particles in suspension and to provide good flow properties to facilitate deposition by screen printing. These compositions are commercially available from DuPont Electronics as the 1600 Birox series of resistors. In one embodiment, the low resistivity layer 16 uses a 100 ohm per square composition which DuPont denotes by the product number of 1621. Such a composition typically includes between 15 and 20 percent Ruthenium compound and 55 to 60 percent glass and is fired in conventional fashion as prescribed by the supplier using an 850 degree C., peak temperature. The 25,000 ohm per square composition is formed by blending DuPont product numbers 1641 (10,000 ohm per square) and 1651 material (100,000 ohm per square). Such a blend typically includes between 5 and 10 percent Ruthemium compound and 65 to 70 percent glass. It too is fired in the prescribed fashion set forth above.

Basically, the different members of the series differ in the relative proportions of the ruthenium compound and the glass included, the more glass the higher the resistivity. Because higher resistivity films have higher glass content, they form a more glassy surface that has a higher resistance to electrical contact thereto. This higher resistance becomes especially significant when the interface is a copper film and among other disadvantages results in a strong dependence of sheet resistance on the aspect ratio of the resistor. I have found that these disadvantages are lessened significantly when a region of low resistivity material is interposed between the high resistance film and the copper film.

The copper layer preferably used is a special copper thick film composition commercially available from DuPont Electronics as DuPont 6001. It comprises finely divided copper particles, a screening agent and small amounts of additives to promote sintering and adhesion. After firing in nitrogen, as prescribed by the supplier with a peak temperature of 600 degrees C., the layer is about ninety five percent copper. Other compositions should be feasible, including some that include one or more other metals that alloy with copper to provide special properties.

Considerable variation in the dimensions of the thick film resistors is possible. A thickness of about 0.5 mil is common for thick film resistors although thicker and thinner layers are feasible. Moreover, both the width and length of thick film resistors are generally between 20 and 200 mils and the aspect ratio tends to be between 0.1 and 10.0, the most widely used range being 0.2 to 5.0.

It has been found that for the compositions above described that it is advantageous to provide at least 5 mils of overlapping along the length of both for the termination regions and for the copper interfaces. This amount of overlap is usually enough to insure the desired low resistance of the interface and also to facilitate satisfactory registration in printing.

Additionally, to minimize registration errors in printing, the termination regions that are included in the low resistance resistors are made wider than the high resistivity layers and narrower than the copper layers to which they interface. This is best seen in the top view of FIG. 5 which will be described more fully below. Likewise, in the low resistance resistors, the copper layer is made wider than the low resistivity layers.

Figure 2A:
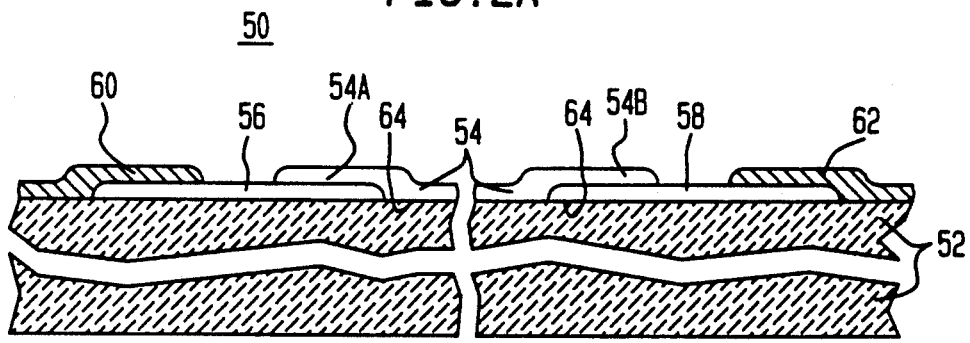
FIG. 2A shows a cross-sectional view of a thick film resistor including post terminations formed in accordance with another embodiment of the invention.

Referring now to FIG. 2A, there is shown a portion of a printed circuit board 50 in accordance with another embodiment of the invention. Printed circuit board 50 comprises an insulator substrate 52 having a top surface 64 on which lies separate termination regions 56 and 58, a resistor 54 having end portions 54A and 54B overlapping the termination regions 56 and 58, respectively, and separate conductors 60 and 62 overlapping termination regions 56 and 58, respectively.

The break shown in about the center of board 50 is used to denote that a body portion of the resistor 54 is typically longer than the end portions 54A and 54B. The substrate 52 is typically considerably thicker than the layers deposited thereon.

Initially, a layer of low resistivity composition is deposited over the top surface 64 of substrate 52 to form separate regions 56 and 58 that serve as low resistance electrical contacts to end portions 54A and 54B respectively, of resistor 54. This layer is also used to form the desired number of low value resistors (not shown) on the printed circuit board 50. Next, a layer of high resistivity composition is deposited over the top surface 64 of substrate 52 to form resistor 54. This layer is dimensioned such that resistor 54 has the desired resistance. End portions 54A and 54B of the resistor 54 overlap portions of termination regions 56 and 58, respectively. As before, the amount of overlap (about 5 mils in a typical embodiment) is sufficient to insure that the interface resistance is at an acceptably small value. Then regions 56 and 58 and resistor 54 are fired in a common firing step. Finally, a conductive copper-rich layer is deposited over the top surface 64 of substrate 52. This layer includes portions 60 and 62 that overlap and make low resistance electrical contacts to regions 56 and 58, respectively. The amount of overlap, as discussed above, is typically about five mils.

Again, considerable variation is possible in the extent of overlap of the various layers.

Figure 2B:
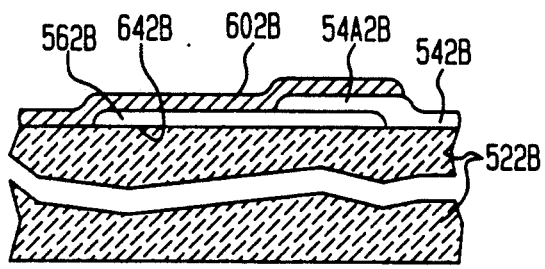
FIGS. 2B, 2C and 2D each show a cross-sectional view of a termination of a thick film resistor formed in accordance with embodiments of the invention that differ from that shown in FIG. 2A in the degree of overlap of the various layers.
Figure 2C:
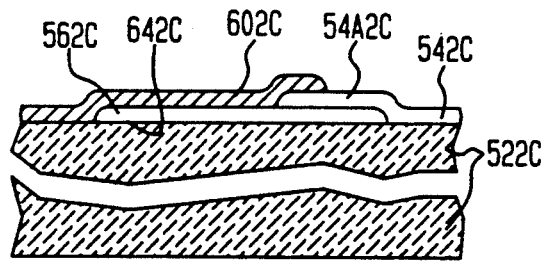
Figure 2D:
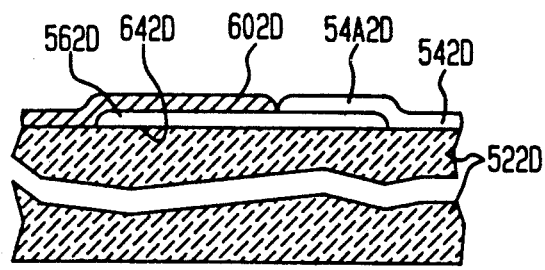

Referring now to FIGS. 2B, 2C and 2D, each of these bears the same relation to FIG. 2A, as FIGS. 1B, 1C and 1D bear to FIG. 1A, described above.

Referring now to FIG. 2B, the conductive layer 602B is shown extending fully over the low resistivity layer 562D including the portion underlying the high resistivity layer 54A2B.

Referring now to FIG. 2C, the conductive layer 602C only partially overlies the portion of low resistivity layer 562C that underlies the high resistivity layer 54A2C.

Referring now to FIG. 2D, the conductive layer 602D extends over only a portion of low resistivity layer 562D and avoids overlapping the high resistivity layer portion 54A2D.

Figure 3:
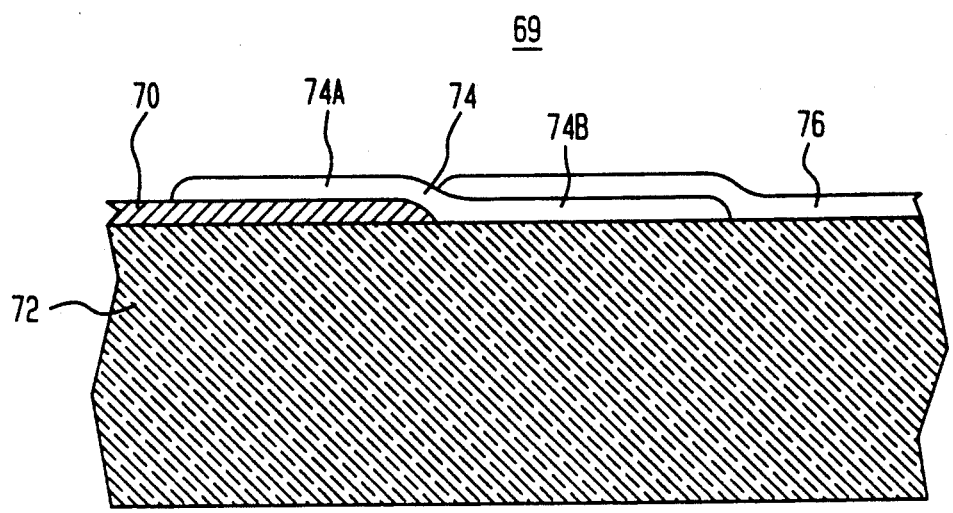
FIG. 3 shows a cross-sectional view formed in accordance with an embodiment of the invention in which a conductive layer is deposited before a thick film resistor.

Referring now to FIG. 3, there is shown a printed circuit board 69 in which a conductive layer 70 is first deposited over a ceramic substrate 72, as is characteristic of a standard termination. This is followed by the deposition of the low resistivity layer 74, typically as part of larger layer consisting of may discrete portions. As shown, layer 74 includes a portion 74A that overlaps the conductive layer 70 and a portion 74B that lies on the substrate 72. Then a layer 76 of high resistivity composition is deposited to form a thick film resistor. The various factors previously discussed for the geometries, degree of overlap, and compositions of the various layers are generally applicable to this embodiment.

Figure 4:
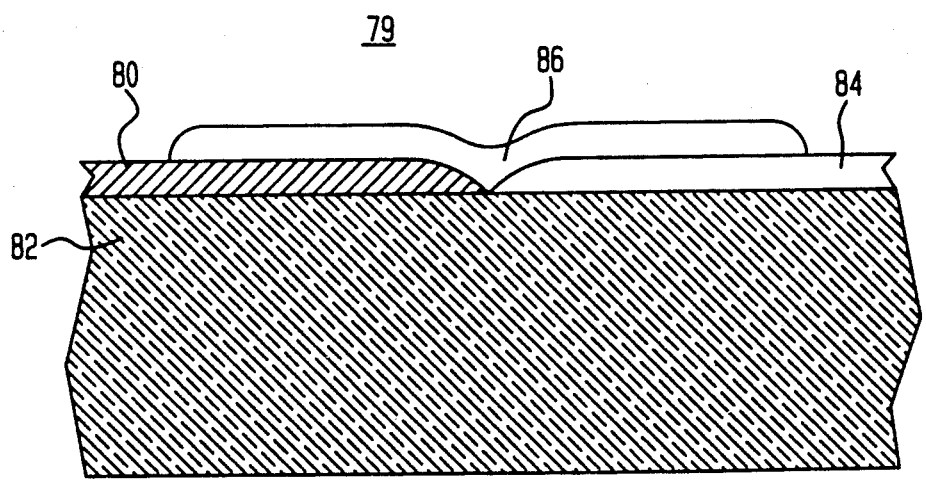
FIG. 4 shows a cross-sectional view formed in accordance with another embodiment of the invention in which a conductive layer is deposited before a thick film resistor.

Referring now to FIG. 4, there is shown a printed circuit board 79 in which a conductive layer 80 is first deposited over a ceramic substrate 82. This is followed by deposition of the high resistivity layer 84 that forms a thick film resistor. Finally, a low resistivity layer 86 is deposited to overlap both conductive layer 80 and the high resistivity layer 84. Again, the factors previously discussed for the geometric degree of overlap, and compositions of the various layers are generally applicable here.

The embodiments of FIGS. 3 and 4 can tolerate a wider range of compositions for the conductive layers than can the embodiments discussed earlier herein. Of course, the conductive layers can be of copper. In such cases the composition of the resistive layers should be compatible therewith. For example, the conductive layer may be of copper fired in nitrogen at 900° C. In this case the resistive layers are chosen so that they can be printed and fired in nitrogen at 900° C.

Alternatively, the conductor can be of a noble metal or an alloy of noble metals, such as Ag, Au, Ag-Pd, that can be fired in air, for example, at 850° C. In this case, the resistive layers are chosen so that they can be printed and fired in air at 850° C.

In these instances, the particular interactions among the materials involved determines which of the embodiments of FIGS. 3 and 4 is preferable.

Figure 5:
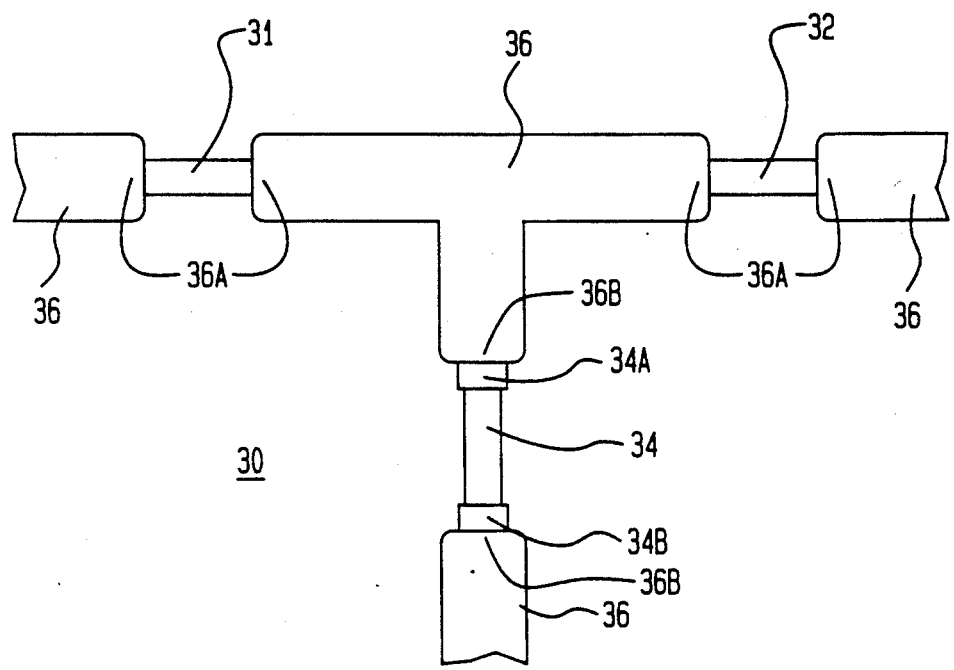
FIG. 5 shows a top view of a portion of printed circuit including three resistors interconnected in accordance with the invention.

Referring now to FIG. 5, there is shown a top view of a portion of a printed circuit 30 that includes a pair of low resistance resistors 31 and 32, a high resistance resistor 34 and a copper layer 36 that provides interconnections. The resistor 34 is provided with termination regions 34A and 34B, of any of the kinds described previously. The copper film 36 interconnects the resistors 31, 32 and 34 into a T section. The copper film 36 is deposited to include portions 36A that overlap the ends of the low resistance resistors 31 and 32 and portions 36B that overlap portions of the termination regions 34A and 34B serving as extended terminations for the high resistance resistor 34.

In an illustrative embodiment, compositions providing a sheet resistivity of 100 ohms/square are used to form the low resistance resistors (10 ohms to 1000 ohms) and compositions providing a sheet resistivity of 25,000 ohms/square are used to form the high resistance resistors (2500 to 250,000 ohms). When resistors of intermediate resistance (1000 to 2500 ohms) are desired, a composition providing a sheet resistivity of 1750 ohms/square is appropriate for use in forming such resistors. As the resistivity of the composition used for forming the resistor increases, the desirability of using a termination region of lower resistivity also increases.

I have found that for printed circuit boards used in automotive applications, the advantage gained by the use of termination regions as described outweighs the added complexity when compositions having sheet resistivity of about 25,000 ohms/square or greater are used. For other applications, this may happen when compositions of even lower resistivities are used.

Of course, by using different aspect ratios and different thicknesses for the thick film layers, different relationships may be established.

It can be appreciated that a wide variety of circuit configurations can be devised. Moreover, it is feasible to include other circuit elements such as capacitors, inductors, diodes and transistors on the printed circuit board in customary fashion.

It is, of course, also feasible to mix on a common printed circuit board both high resistance resistors terminated in the manner described and high resistance resistors terminated in conventional fashion where the resistances of the latter have tolerances sufficiently wide.

It is, of course, feasible to use a variety of compositions for the thick film resistors. To the extent that such compositions result in resistors that profit by the inclusions of post terminations in the manner discussed, the principles of this invention should be applicable.

Only high resistance resistors are needed in some circuits. Then the termination regions are portions of a layer of low resistivity composition used only to provide such terminations.

In light of the foregoing, it should also be understood that in the following claims, wide latitude should be given to the terms high resistance, low resistance, high resistivity and low resistivity. Each is intended generally to denote relative relationships rather than an absolute value.

The embodiments of the invention in which an exclusive property or privilege is claimed are defined as follows:

1. A process for forming a printed circuit including thick film resistors having both high and low resistances on an insulating substrate comprising the steps of:
    printing on an insulating substrate a pattern of a first composition of resistive material for the formation of at least one low resistance thick film resistor and
    . the formation of regions for use as terminations of at least one high resistance thick film resistor;
    printing on the insulating substrate a pattern of a second composition of resistive material for the formation of at least one high resistance thick film resistor, each such resistor having end portions overlapping the termination regions of the first composition; and
    printing on the insulating substrate a patterned copper-rich layer, the layer including portions overlapping end portions of the low resistance resistors formed of the first composition and overlapping portions of the termination regions not overlapped by the end portions of the high resistance resistors and wherein the patterns of first and second composition are fired in a common step before printing of the pattern of a copper-rich layer and wherein the first composition has a sheet resistivity of about 100 ohms per square and the second composition has a sheet resistivity of about 25,000 ohms per square.

2. A process for forming a printed circuit including thick film resistors having both high and low resistances on an insulating substrate comprising the steps of:
    printing on an insulating substrate a patterned layer of a first composition suitable for forming at least one high resistance thick film resistor;
    printing on the insulating substrate a patterned layer of second composition suitable for forming at least one low resistance thick film resistor and for including termination regions for the high resistance resistors, said termination regions including portions overlapping ends of the high resistance thick film resistors; and
    printing on the insulating substrate a patterned copper-rich layer, the layer overlapping end portions of the low resistance resistors and portions of the termination regions of the patterned layer of second composition and wherein the patterned layers of first and second compositions are fired in a common step before the printing of the patterned copper-rich layer and wherein the first composition has a sheet resistivity of about 25,000 ohms per square and the second composition has a sheet resistivity of about 100 ohms per square.

3. A process for forming a printed circuit including thick film resistors having both high and low resistances on an insulating substrate comprising the steps of:

printing on an insulating substrate a pattern of a first composition of resistive material for the formation of at least one low resistance thick film resistor and the formation of regions for use as terminations of at least one high resistance thick film resistor;

printing on the insulating substrate a pattern of a second composition of resistive material for the formation of at least one high resistance thick film resistor, each such resistor having end portions overlapping the termination regions of the first composition; and printing on the insulating substrate a patterned copper-rich layer, the layer including portions overlapping end portions of the low resistance resistors formed of the first composition and overlapping portions of the termination regions not overlapped by the end portions of the high resistance resistors.

4. The process of claim 3 in which the patterns of first and second composition are fired in a common step before printing of the pattern of a copper-rich layer.

5. A process for forming a printed circuit including thick film resistors having both high and low resistances on an insulating substrate comprising the steps of:

printing on an insulating substrate a patterned layer of a first composition suitable for forming at least one high resistance thick film resistor;

printing on the insulating substrate a patterned layer of second composition suitable for forming at least one low resistance thick film resistor and for including termination regions for the high resistance resistors, said terminations regions including portions overlapping ends of the high resistance thick film resistors; and printing on the insulating substrate a patterned copper-rich layer, the layer overlapping end portions of the low resistance resistors and portions of the termination regions of the patterned layer of second composition.

6. The process of claim 5 in which the patterned layers of first and second compositions are fired in a common step before the printing of the patterned copper-rich layer.

7. The process for forming a printed circuit which includes at least one thick film resistor comprising the steps of:

forming on an insulating substrate a layer of relatively high sheet resistivity material and a layer of relatively low sheet resistivity material in overlapping relationship, the layer of relatively high sheet resistivity defining at least one thick film resistor, the layer of relatively low sheet resistivity defining termination regions at respective ends of the resistor; and forming a copper-rich layer on the insulating substrate including portions which overlap the termination regions.

8. A process for forming a printed circuit that includes at least one thick film resistor comprising the steps of:

depositing a conductive layer on a ceramic substrate; and depositing both a layer of high resistivity composition and a layer of low resistivity composition to form a thick film resistor of the layer of high resistivity and a termination region of low resistivity composition that contacts both an extended portion of the conductive layer and an end portion of the thick film resistor to serve as an interface between said conductive layer and said end portion of the thick film resistor.

* * * * *